(12) United States Patent
Shim et al.

(10) Patent No.: US 9,384,841 B2
(45) Date of Patent: Jul. 5, 2016

(54) SEMICONDUCTOR DEVICE, SEMICONDUCTOR SYSTEM HAVING THE SAME AND OPERATING METHOD THEREOF

(71) Applicant: SK hynix Inc., Icheon-si Gyeonggi-do (KR)

(72) Inventors: Keon Soo Shim, Icheon-si (KR); Hyun Seung Yoo, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 39 days.

(21) Appl. No.: 14/497,596

(22) Filed: Sep. 26, 2014

(65) Prior Publication Data

US 2015/0340096 A1    Nov. 26, 2015

(30) Foreign Application Priority Data

May 26, 2014 (KR) .................. 10-2014-0063079

(51) Int. Cl.
| | |
|---|---|
| G11C 11/34 | (2006.01) |
| G11C 16/12 | (2006.01) |
| G11C 16/08 | (2006.01) |
| G11C 5/06 | (2006.01) |
| G11C 8/08 | (2006.01) |
| G11C 8/12 | (2006.01) |

(52) U.S. Cl.
CPC .............. G11C 16/12 (2013.01); G11C 5/063 (2013.01); G11C 8/08 (2013.01); G11C 8/12 (2013.01); G11C 16/08 (2013.01)

(58) Field of Classification Search
CPC ............ H01L 27/11582; H01L 27/1157; H01L 27/11524; H01L 27/11578; H01L 27/11565; H01L 16/0483; H01L 5/02; H01L 2213/71; H01L 7/18; G11C 16/12; G11C 16/08

USPC ............ 365/185.03, 185.05, 185.11, 185.17, 365/185.18, 185.23, 185.25, 185.26, 185.13
See application file for complete search history.

(56) References Cited

U.S. PATENT DOCUMENTS

| | | | | |
|---|---|---|---|---|
| 2012/0314514 A1* | 12/2012 | Kwon | ....................... | G11C 7/18 365/189.09 |
| 2013/0215684 A1* | 8/2013 | Oh | .................... | H01L 27/11582 365/185.29 |
| 2013/0223150 A1* | 8/2013 | Tanzawa | ............ | G11C 11/5621 365/185.17 |
| 2014/0226415 A1* | 8/2014 | Toyama | ................. | G11C 16/24 365/185.25 |

FOREIGN PATENT DOCUMENTS

KR    1020130031483 A    3/2013

* cited by examiner

*Primary Examiner* — Fernando Hidalgo
(74) *Attorney, Agent, or Firm* — William Park & Associates Ltd.

(57) ABSTRACT

A semiconductor device may include memory blocks having a plurality of strings including drain select transistors and memory cells electrically coupled in series between a bit line and a pipe transistor and source select transistors and memory cells electrically coupled in series between a common source line and the pipe transistor; a circuit group configured to float drain select lines electrically coupled to the drain select transistors included in unselected memory blocks and source select lines electrically coupled to the source select transistors included in the unselected memory blocks and to ground a pipe line electrically coupled to the pipe transistor when a program operation of a selected memory block among the memory blocks is performed; and a control circuit configured to control the circuit group.

18 Claims, 5 Drawing Sheets

SEMICONDUCTOR DEVICE, SEMICONDUCTOR SYSTEM HAVING THE SAME AND OPERATING METHOD THEREOF

CROSS-REFERENCE TO RELATED APPLICATION

The present application claims priority to Korean Patent Application Number 10-2014-0063079, filed on May 26, 2014, the entire disclosure of which is incorporated herein in its entirety by reference.

BACKGROUND

1. Field of Invention

Various embodiments of the invention relate generally to an electronic device and a method, and more particularly, to a semiconductor device having a three-dimensional structure, a semiconductor system having the same and a programming method thereof.

2. Description of Related Art

Semiconductor devices are classified into two-dimensional and three-dimensional memory devices depending on the memory string configurations.

The two-dimensional memory device includes a string in which memory cells are arranged parallel to each other over a semiconductor substrate. The three-dimensional memory device includes a string in which memory cells are arranged in a vertical direction to the semiconductor substrate.

The three-dimensional memory devices may be smaller than the two-dimensional memory devices in device size. Since memory cells may be stacked in a vertical direction in the three-dimensional memory device, the three-dimensional memory device may be advantageous in high integration. However, as the size of the devices making up the three-dimensional memory device becomes smaller, the memory device may have reduced reliability even when there is a small change to electrical characteristics.

SUMMARY

An embodiment of the invention may provide a semiconductor device including memory blocks having a plurality of strings comprising drain select transistors and memory cells electrically coupled in series between a bit line and a pipe transistor and source select transistors and memory cells electrically coupled in series between a common source line and the pipe transistor. The semiconductor device may also include a circuit group configured to float drain select lines electrically coupled to the drain select transistors included in unselected memory blocks and source select lines electrically coupled to the source select transistors included in the unselected memory blocks and to ground a pipe line electrically coupled to the pipe transistor when a program operation of a selected memory block among the memory blocks is performed. Further, the semiconductor device may include a control circuit configured to control the circuit group.

A method for operating a semiconductor device of the invention may comprise floating word lines, drain select lines and source select lines electrically coupled to the strings of unselected memory blocks and grounding pipe lines, when a program operation of a selected memory block among the memory blocks having U-shaped strings is performed.

A method of operating a semiconductor having U-shaped strings including memory cells, pipe transistors, drain select transistors and source select transistors. The method may comprise floating drain select lines electrically coupled to the drain select transistors and source select lines electrically coupled to the source select transistors of unselected memory blocks and grounding pipe lines electrically coupled to the pipe transistors of the unselected memory blocks during a program operation of a selected memory block among the memory blocks.

DETAILED DESCRIPTION

Hereinafter, an embodiment of the invention will be described. In the drawings, the thicknesses and the lengths of elements may be exaggerated for convenience of illustration. In describing the invention, configurations, structures, and methods that are commonly known to those skilled in the art may be omitted to avoid obscuring the invention. Throughout the drawings, like reference numerals refer to like elements. Various embodiments of the invention are directed to a semiconductor device capable of improving reliability of a three-dimensional semiconductor device, a system having the same and an operating method thereof.

Figure 1:
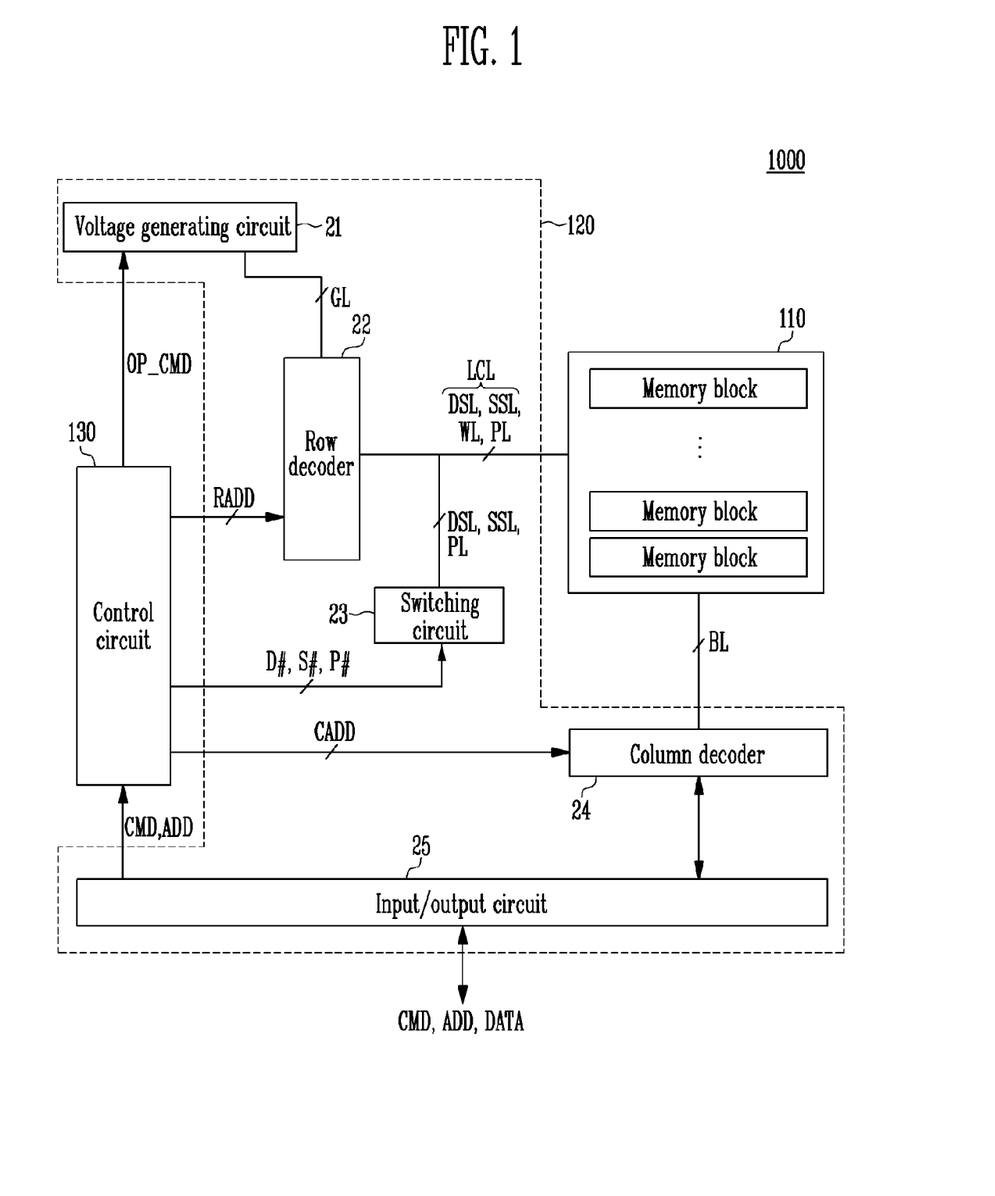
FIG. 1 is a block diagram illustrating a semiconductor device according to an embodiment.

Referring to FIG. 1, a block diagram illustrating a semiconductor device according to an embodiment is shown.

A semiconductor device 1000 may include a memory cell array 110 for storing data, a circuit group 120 for performing program, read and erase operations on the memory cell array 110, and a control circuit 130 for controlling the circuit group 120.

The memory cell array 110 may include a plurality of memory blocks. The memory blocks may include a plurality of strings having three-dimensional structure.

The circuit group 120 may include a voltage generator 21, a row decoder 22, a switching circuit 23, a column decoder 24 and an input/output circuit 25.

The voltage generator 21 may generate voltages having various levels needed for program, erase or read operations in response to an operating command signal OP_CMD. The voltages may be transferred to global lines GL.

The row decoder 22 may select one of the memory blocks which will perform a program, erase or read operation in response to a row address RADD. The row decoder 22 may transfer the voltages supplied via the global lines GL to local lines LCL electrically coupled to the selected memory block. The local lines LCL may include drain select lines DSL, source select lines SSL, word lines WL and pipe lines PL.

The switching circuit 23 may ground certain lines among the local lines LCL in response to switching signals D#, S# and P#. For instance, the switching circuit 23 may individually ground the drain select line DSL, the source select line SSL and the pipe lines PL in response to the switching signals D#, S# and P#.

The switching signals D#, S# and P# may include drain switching signals D#, source switching signals S# and pipe switching signals P#. The control circuit may output the drain switching signals D#, the source switching signals S# and the pipe switching signals P#, high or low, depending on an operating condition.

The column decoder 24 may be electrically coupled to the memory cell array 110 via the bit lines BL. The column decoder 24 may give or receive data transferred via the bit lines BL in response to a column address CADD.

The input/output circuit 25 may transfer externally provided command signal CMD and address ADD to the control circuit 130. The input/output circuit 25 may also transfer data transferred from the column decoder 24 to an external device or transfer externally provided data DATA to the column decoder 24.

The control circuit 130 may output an operating command signal OP_CMD, the row address RADD, the column address CADD and the switching signals to control the circuit group 120 in response to the command signal CMD and the address ADD.

The control circuit 130 may float the drain select lines DSL, the source select lines SSL and the word lines WL electrically coupled to unselected memory blocks. The control circuit 130 may also ground the pipe lines PL to control the circuit group 120 during a program operation of the selected memory block.

Figure 2:
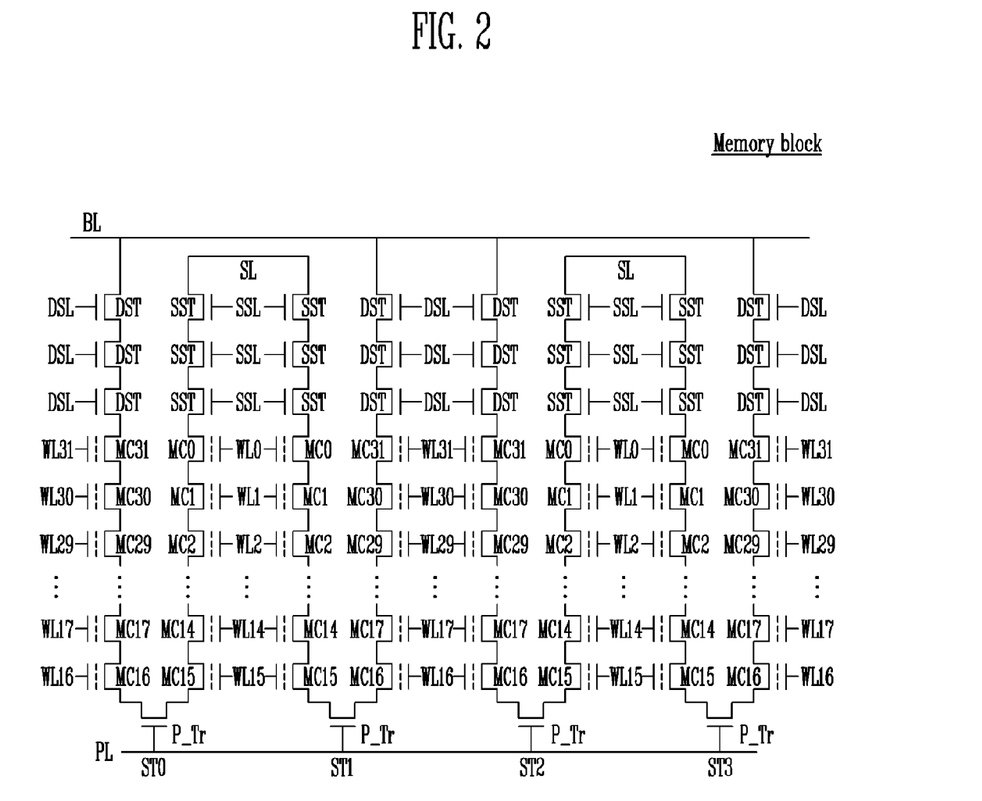
FIG. 2 is a circuit diagram illustrating a memory block shown in FIG. 1.

Referring to FIG. 2, a circuit diagram illustrating the memory block shown in FIG. 1 is illustrated.

The memory block may include a plurality of U-shaped strings ST0 to ST3. Although FIG. 2 shows four strings ST0 to ST3, there may be further strings depending on the semiconductor device. For example, the string ST0 may include a plurality of source select transistors SST, memory cells MC0 to MC16, drain select transistors DST and a pipe transistor P-Tr. The memory cells MC0 to MC15 may be electrically coupled in series between the source select transistors SST and the pipe transistor P_Tr. The memory cells MC16 to MC31 may be electrically coupled vertically between the pipe transistor P_Tr and the drain select transistors DST. Although FIG. 2 shows that 32 memory cells MC0 to MC31, three source select transistors SST and three drain select transistors DST are included in each string, and the number of devices may vary depending on the semiconductor device.

Gates of the source select transistors SST may be electrically coupled to the source select lines SLL, gates of the memory cells MC0 to MC31 may be electrically coupled to the word lines WL0 to WL31, and gates of the drain select transistors DST may be electrically coupled to the drain select lines DSL. A gate of the pipe transistor P_Tr may be electrically coupled to the pipe line PL.

A drain of the drain select transistor DST formed on an uppermost part may be electrically coupled to the bit line BL, and a source of the source select transistor SST may be electrically coupled to a common source line SL.

Remaining memory blocks may be similarly configured as the memory block shown in FIG. 2.

Figure 3:
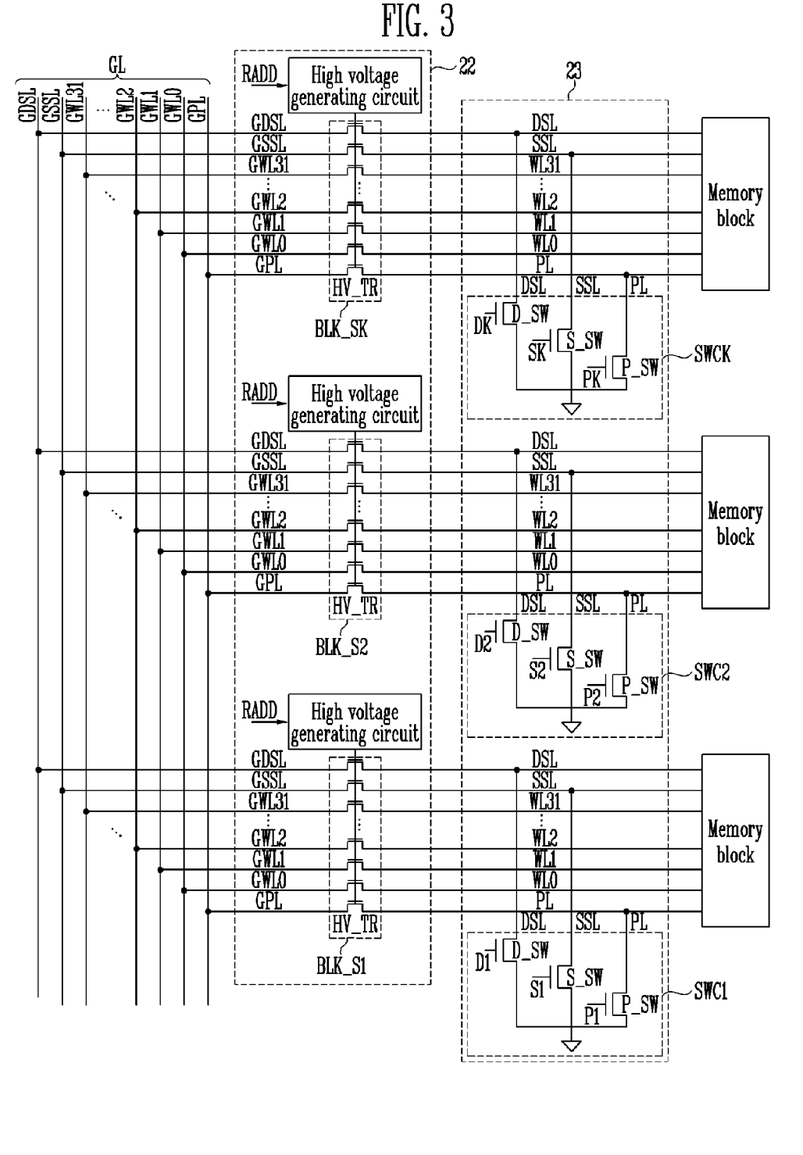
FIG. 3 is a circuit diagram illustrating a row decoder and a switching circuit shown in FIG. 1 and a program operation according to an embodiment.

Referring to FIG. 3, a circuit diagram illustrating the row decoder and the switching circuit shown in FIG. 1 and a program operation according to an embodiment is shown.

The global lines GL may include a global drain select line GDSL, a global source select line GSSL, global word lines GWL0 to GWL31 and a global pipe line GPL. Voltages having various levels generated in the voltage generating circuit 21 shown in FIG. 1 may be transferred to the global lines GL.

The row decoder 22 may transfer the voltages applied to the global lines GL to the local lines DSL, SSL, WL0 to WL31 and PL of the selected memory block in response to the row address RADD.

The row decoder 22 may be configured to transfer voltages to the high voltage generating circuits configured to generate high voltages in response to the row address RADD. The row decoder 22 may be configured to transfer voltages applied to the global word lines GL to the local lines DSL, SSL, WL0 to WL31 and PL by electrically coupling the global word lines GL and the local lines DSL, SSL, WL0 to WL31 and PL depending on the high voltages generated by the high voltage generating circuits.

For example, if k memory blocks (where k is a positive integer) are included in the memory cell array 110 (as shown in FIG. 1), k high voltage generating circuits and k block selection circuits BLK_S1 to BLK_Sk may be included in the memory cell array 110 as well. During a program operation, the high voltage generating circuits may generate a high voltage in response to the row address RADD. Depending on the row address RADD, only one high voltage generating circuit among the k high voltage generating circuits may generate high voltage, and remaining high voltage generating circuits may not generate high voltage. The memory block which corresponds to the high voltage generating circuit that generates high voltage may be the selected memory block which is a program target memory block during the program operation The block selection circuits BLK_S1 to BLK_Sk may include a plurality of high voltage pass transistors HV_TR electrically coupled between the global lines GL and the local lines DSL, SSL, WL0 to WL31 and PL. For instance, each of the block selection circuits BLK_S1 to BLK_Sk may be electrically coupled between the local lines DSL, SSL, WL0 to WL31 and PL which are electrically coupled to each memory block and the global lines GL. Therefore, when high voltage is generated by the high voltage generating circuit, the high voltage pass transistors HV_TR may be turned on concurrently, and the global lines GL and the local lines DSL, SSL, WL0 to WL31 and PL electrically coupled to the corresponding block selection circuit may be electrically coupled to each other. Each voltage transferred to the global lines GL may be transferred to the selected memory block via each of the local lines DSL, SSL, WL0 to WL31 and PL.

The switching circuits 23 may include k select switching circuits SWC1 to SWCk which may have similar configurations to each other. Each of the select switching circuits SWC1 to SWCk may include the drain switching transistor D_SW, the source switching transistor S_SW and the pipe switching transistor P_SW, each being electrically coupled to the drain select line DSL, the source select line SSL, and the pipe line PL included in each of the local lines DSL, SSL, WL0 to WL31 and PL. The drain switching transistors D_SW included in the select switching circuits SWC1 to SWCk may be electrically coupled between the drain select line DSL of each local line and a ground terminal and may operate in response to drain s signals D1 to Dk. The source switching transistors S_SW may be electrically coupled between the source select line DSL of each local line and the ground terminal and may operate in response to source switching signals S1 to Sk. The pipe switching transistors P_SW may be electrically coupled between the pipe line PL of each local line and the ground terminal and may operate in response to pipe signals P1 to Pk.

Referring to the above-described device, a program operation when the k-th memory block is selected to be programmed is described as follows.

When the program operation commences, the voltage generating circuit 21 (as shown in FIG. 1) may generate voltages to be applied to the drain select line DSL, the source select line SSL, the word lines WL0 to WL31 and the pipe line PL of the selected memory block. The voltage generating circuit 21 may also apply each of the voltages to a global drain select line GDSL, a global source select line GSSL, global word lines GWL0 to GWL31 and a global pipe line GPL.

In response to the row address RADD, only a k-th high voltage generating circuit may generate high voltage among the high voltage generating circuits, and remaining first to (k−1)th high voltage generating circuits may not generate the high voltage.

When the k-th high voltage generating circuit generates the high voltage, the high voltage pass transistors HV_TR included in the k-th block selection circuit BLK_Sk may be all turned on. The voltages applied to the global drain select line GDSL, the global source select line GSSL, the global word lines GWL0 to GWL31 and the global pipe line GPL may be transferred to the drain select line DSL, the source select line SSL, the word lines WL0 to WL31 and the pipe line PL electrically coupled to the k-th memory block. For instance, a turn on voltage may be transferred to the drain select line DSL, a turn off voltage (e.g., 0V) may be transferred to the source select line SSL, a program voltage or a pass voltage may be transferred to the word lines WL0 to WL31. Further, a pass voltage may be transferred to the pipe line PL.

The drain switching transistor D_SW, the source switching transistor S_SW, and the pipe switching transistor P_SW of the k-th switching circuit SWCk electrically coupled to the k-th memory block may be all turned off such that the voltages applied to the global drain select line GDSL, the global source select line GSSL, the global word lines GWL0 to GWL31 and the global pipe line GPL may be transferred to the drain select line DSL, the source select line SSL, the word lines WL0 to WL31 and the pipe line PL electrically coupled to the k-th memory block. To this end, the control circuit 130 (as shown in FIG. 1) may output a low k-th drain switching signal Dk, a low k-th source switching signal Sk and a low k-th pipe switching signal Pk.

When the k-th high voltage generating circuit generates high voltage, the first to (k−1)th high voltage generating circuits may not generate the high voltage. Accordingly, the high voltage pass transistors HV_TR of the first to (k−1)th block selection circuits BLK_S1 to BLK_Sk−1 may all be turned off, and all of the local lines DSL, SSL, WL0 to WL31 and PL electrically coupled to unselected first to (k−1)th memory blocks may be floated.

To prevent leakage current from occurring inside strings included in the unselected first to (k−1)th memory blocks, the drain select line DSL and the source select line SSL electrically coupled to the unselected first to (k−1)th memory blocks may be maintained in the floating state, and the pipe line PL may by grounded. To this end, the control circuit 130 (as shown in FIG. 1) may output the first to (k−1)th drain switching signals D1 to Dk−1, the first to (k−1)th source switching signals S1 to Sk−1 and the k-th pipe switching signal Pk having a low level. The control circuit 130 may also output the first to (k−1)th pipe switching signals P1 to Pk−1 having a high level.

The above-described programs may be summarized in Table 1 below.

TABLE 1

| BLK (block) | Line/Signal | Voltage |
| --- | --- | --- |
| Sel. BLK (kth memory block) | DSL | Vdsl |
| | SSL | 0 V |
| | WL | Vpgm/Vpass |
| | Dk | Low |
| | Sk | Low |
| | Pk | Low |
| Unsel. BLK (1st to (k−1)th memory blocks) | DSL | Floating |
| | SSL | Floating |
| | WL | Floating |
| | D1 to Dk-1 | Low |
| | S1 to Sk-1 | Low |
| | P1 to Pk-1 | High |

Referring to Table 1, a turn on voltage Vdsl may be applied to the drain select line DSL of a selected memory block Sel. BLK. Further, a turn off voltage (e.g., 0V) may be applied to the source select line SSL. Moreover, a program voltage Vpgm may be applied to a word line selected among the word lines WL. In addition, a pass voltage Vpass may be applied to remaining word lines, the drain switching signal Dk having a low level may be applied to the drain switching transistor D_SW, the source switching signal Sk having a low level may be applied to the source switching transistor S_SW and the pipe switching signal Pk having a low level may be applied to the pipe switching transistor P_SW.

The drain select lines DSL, the source select lines SSL and the word lines WL of unselected memory blocks Unsel. BLK may all be in the floating state, the low drain switching signals D1 to Dk−1 and the source switching signals S1 to Sk−1 having a low level may be applied to the drain switching transistors D_SW and the source switching transistors S_SW, and pipe switching signals P1 to Pk−1 having a high level may be applied to the pipe switching transistors P_SW.

Although not mentioned in Table 1, the selected memory block Sel. BLK and the unselected memory blocks Unsel. BLK may share the bit lines BL. In addition, a program permission voltage (e.g., 0V) may be applied to selected bit lines among the bit lines BL, and a program prohibition voltage (e.g., Vcc) may be applied to unselected bit lines. Further, Vcc may be applied to the common source line SL.

If, in the case where the program prohibition voltage (e.g., Vcc) is applied to the unselected bit lines, a low voltage of 0V is applied to the drain and source select lines DSL and SSL of the unselected memory blocks, an electron-hole pair EHP may occur due to the voltage difference between the gate of the drain and source select transistors DST and SST and drain or source of the drain or source select transistors DST. When the electron-hole pair EHP occurs, a current path may be formed while a path for some of the carriers is formed. As a result, leakage current may occur.

In an embodiment, since the voltage difference between both voltages which are applied to the bit lines BL may be reduced as the drain select lines DSL and the source select lines SSL electrically coupled to the unselected memory blocks Unsel. BLK may be floated, leakage current may be prevented from occurring at the drain and source select transistors DST and SST.

If the source select lines electrically coupled to the unselected memory blocks Unsel. BLK are floated, the voltage of Vcc applied to the common source line SL may be reduced. As a result, the program efficiency of the selected memory block Sel. BLK may deteriorate. To avoid this, 0V may be applied to the pipe lines PL electrically coupled to the unselected memory blocks Unsel. BLK. When 0V is applied to the pipe lines PL electrically coupled to the unselected memory blocks Unsel. BLK, leakage current which flows to the common source line SL in the string may be blocked. In addition, the efficiency of the program operation of the selected memory block Sel. BLK may be prevented from deteriorating.

Figure 4:
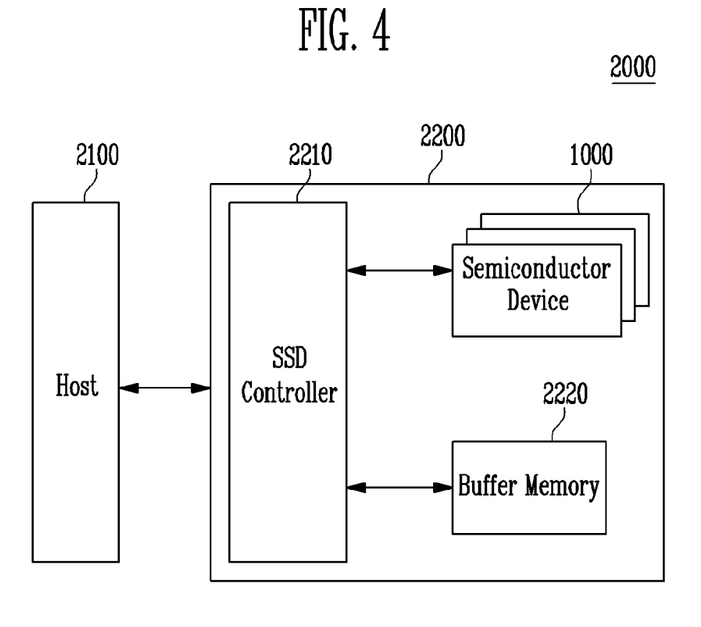
FIG. 4 is a block diagram illustrating a solid state drive including a semiconductor device according to an embodiment.

Referring to FIG. 4, a block diagram illustrating a solid state drive including a semiconductor device according to an embodiment is shown.

A drive device 2000 may include a host 2100 and an SSD 2200. The SSD 2200 may include an SSD controller 2210, a buffer memory 2220 and a semiconductor device 1000.

The SSD controller 2210 may provide a physical connection between the host 2100 and the SSD 2200. In other words, the SSD controller 2210 may perform interfacing with the SSD 2200 in response to a bus format of the host 2100. The SSD controller 2210 may decode a command provided from the host 2100. According to a decoding result, the SSD controller 2210 may access the semiconductor device 1000. As the bus format of the host 2100, Universal Serial Bus (USB), Small Computer System Interface (SCSI), Peripheral Component Interconnect Express (PCI-E), Advanced Technology Attachment (ATA), Parallel ATA (PATA), Serial ATA (SATA), and Serial Attached SCSI (SAS) may be included.

The buffer memory 2220 may temporarily store program data provided from the host 2100 or data read from the semiconductor device 1000. When a read request is made by the host 2100, if data in the semiconductor device 1000 is cached, the buffer memory 2220 may support a cache function to directly provide the cached data to the host 2100. In general, data transfer speed by the bus format (for example, SATA or SAS) of the host 2100 may be higher than the transfer speed of a memory channel of the SSD 2200. In other words, when an interface speed of the host 2100 is higher than the transfer speed of the memory channel of the SSD 2200, performance degradation caused by the speed difference may be minimized by providing a buffer memory 2220 with a large capacity. The buffer memory 2220 may be provided as Synchronous DRAM to provide sufficient buffering in the SSD 2200.

The semiconductor device 1000 may be provided as a storage medium of the SSD 2200. For instance, the semiconductor device 1000 may be provided as a nonvolatile memory device having large storage capacity as described above in detail with reference to FIG. 1. The semiconductor device 1000 may be a NAND-type flash memory.

Figure 5:
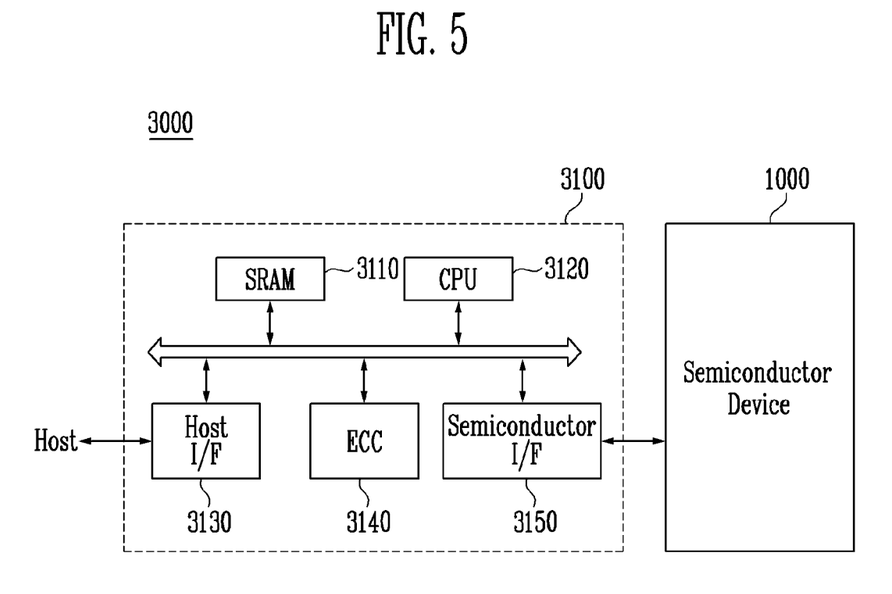
FIG. 5 is a block diagram illustrating a memory system including a semiconductor device according to an embodiment.

Referring to FIG. 5, a block diagram illustrating a memory system including a semiconductor device according to an embodiment is shown.

A memory system 3000 may include a memory control unit 3100 and the semiconductor device 1000.

Since the semiconductor device 1000 may have substantially the same configuration as shown in FIG. 1, a detailed description may be omitted.

The memory control unit 3100 may be configured to control the semiconductor device 1000. An SRAM 3110 may be used as a working memory of a CPU 3120. A host interface (I/F) 3130 may include a data exchange protocol of a host electrically coupled with the memory system 3000. An error correction circuit (ECC) 3140 in the memory control unit 3100 may detect and correct an error in data read from the semiconductor device 1000. A semiconductor I/F 3150 may interface with the semiconductor device 1000. The CPU 3120 may perform a control operation for data exchange of the memory control unit 3100. In addition, although not illustrated in FIG. 5, a ROM for storing code data for interfacing with a host may be provided in the memory system 3000.

In an embodiment, the memory system 3000 may be applied to one of a computer, an Ultra Mobile PC (UMPC), a workstation, a net-book, a PDA, a portable computer, a web tablet, a wireless phone, a mobile phone, a smartphone, a digital camera, a digital audio recorder, a digital audio player, a digital picture recorder, a digital picture player, a digital video recorder, a digital video player, a device of transmitting and receiving information in a wireless environment, and various devices constituting a home network.

Figure 6:
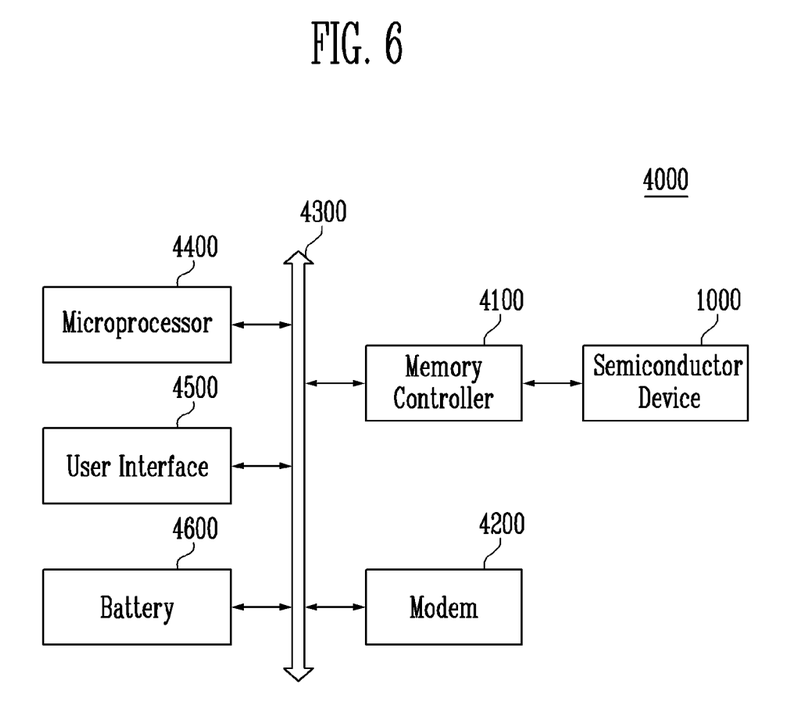
FIG. 6 is a schematic view illustrating a computing system including a semiconductor device according to an embodiment.

Referring to FIG. 6, a block diagram illustrating a computing system 400 including a semiconductor device according to an embodiment of the invention is shown.

The computing system 4000 includes an embodiment of a semiconductor device 1000 electrically coupled to a bus 4300, a memory controller 4100, a modem 4200, a microprocessor 4400, and a user interface 4500. When the computing system 4000 is a mobile device, a battery 4600 for supplying an operation voltage of the computing system 4000 may be additionally provided. The computing system 4000 may include an application chip set, a camera image processor (CIS), a mobile DRAM, and the like.

The semiconductor device 1000 may be configured in substantially the same manner as the semiconductor device 1000 shown in FIG. 1. Thus, a detailed description will be omitted.

The memory controller 4100 and the semiconductor device 1000 may be components of a Solid State Drive/Disk (SSD).

The semiconductor device 1000 and the memory controller 4100 may be mounted using various types of packages. For instance, the semiconductor device 1000 and the memory controller 4100 may be mounted using packages such as Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-level Processed Stack Package (WSP), and the like.

According to embodiments of the invention, the reliability of program, read and erase operations of a semiconductor device may be improved by equalizing electrical characteristics of selection transistors included in a semiconductor device.

Embodiments have been disclosed in the drawings and the specification as described above. The specific terms used are for purposes of illustration and do not limit the scope of the invention as defined by the claims. Accordingly, those skilled in the art will appreciate that various modifications and another equivalent examples may be made without departing from the scope and spirit of the disclosure. Therefore, the sole scope of technical protection of the invention will be defined by the technical spirit of the accompanying claims.

What is claimed is:

1. A semiconductor device, comprising:
    memory blocks including a plurality of strings that include drain select transistors and memory cells electrically coupled in series between a bit line and a pipe transistor and source select transistors and memory cells electrically coupled in series between a common source line and the pipe transistor;
    a circuit group configured to float drain select lines electrically coupled to the drain select transistors included in unselected memory blocks and source select lines electrically coupled to the source select transistors included in the unselected memory blocks and to ground a pipe line electrically coupled to the pipe transistor included in the unselected memory blocks when a program operation of a selected memory block among the memory blocks is performed; and a control circuit configured to control the circuit group.

2. The semiconductor device of claim 1, wherein the circuit group comprises:

a voltage generating circuit configured to generate voltages having various levels and to transfer the voltages to global lines in response to an operating command signal;

a row decoder configured, in response to a row address, to select one memory block among the memory blocks, to electrically couple local lines electrically coupled to the selected memory block and the global lines to transfer the voltages applied to the global lines to the local lines, and to block local lines respectively electrically coupled to the unselected memory blocks and the global lines;

select switching circuits respectively electrically coupled to the local lines and configured, in response to switching signals, to float the drain select lines and the source select lines electrically coupled to the unselected memory blocks among the local lines, to ground the pipe lines and to float the drain select lines, the source select lines and the pipe lines electrically coupled to the selected memory block; and a column decoder configured, in response to a column address, to send data to, or receive data from, bit lines electrically coupled to the memory blocks in common.

3. The semiconductor device of claim 2, wherein the row decoder comprises:

a plurality of high voltage generating circuits configured to generate a high voltage in response to the row address; and block selection circuits configured to electrically couple local lines electrically coupled to the selected memory block and the global lines in response to the high voltage.

4. The semiconductor device of claim 2, wherein each of the select switching circuits comprises:

a drain switching circuit configured to electrically couple or block the drain select line and a ground terminal in response to a drain switching signal;

a source switching transistor configured to electrically couple or block the source select line and the ground terminal in response to a source switching signal; and a pipe switching transistor configured to electrically couple or block the pipe line and the ground terminal in response to a pipe signal.

5. The semiconductor device of claim 4, wherein, the drain switching transistor, the source select transistor and the pipe transistor of the select switching circuit electrically coupled to the local lines of the selected memory block among the select switching circuits are turned off during a program operation of the selected memory block.

6. The semiconductor device of claim 4, wherein, when the program operation of the selected memory block is performed, the drain switching transistors and the source select transistors of the select switching circuits electrically coupled to the local lines of the unselected memory blocks among the select switching circuits are turned on.

7. A method of operating a semiconductor device, comprising:

floating word lines, drain select lines and source select lines electrically coupled to strings of unselected memory blocks and grounding pipe lines electrically coupled to the strings of the unselected memory blocks, when a program operation of a selected memory block among the memory blocks having U-shaped strings is performed.

8. The method of claim 7, comprising, when the program operation of the selected memory block is performed, applying a program voltage to a selected word line among the word lines of the selected memory block, applying a pass voltage to remaining unselected word lines, applying a turn on voltage to drain select lines, applying a turn off voltage to source select lines and applying the pass voltage to pipe lines.

9. The method of claim 7, comprising, when the program voltage of the selected memory block is performed, applying a program permission voltage or a program prohibition voltage to bit lines electrically coupled to the selected memory block and the unselected memory blocks in common.

10. A method of operating a semiconductor having U-shaped strings including memory cells, pipe transistors, drain select transistors and source select transistors, the method comprising:

floating drain select lines electrically coupled to the drain select transistors of unselected memory blocks and source select lines electrically coupled to the source select transistors and grounding pipe lines electrically coupled to the pipe transistors of the unselected memory blocks during a program operation of a selected memory block among the memory blocks.

11. The method of claim 10, wherein the program operation of the selected memory block comprises:

applying a program voltage to a selected word line electrically coupled to selected memory cells among the memory cells of the selected memory block and applying a pass voltage to unselected word lines electrically coupled to remaining unselected memory cells;

applying a turn on voltage to drain select lines electrically coupled to the drain select transistors of the selected memory block;

applying a turn off voltage to source select lines electrically coupled to the source select transistors of the selected memory block; and applying the pass voltage to pipe lines electrically coupled to the pipe transistors of the selected memory block.

12. The method of claim 11, further comprising:

turning off a drain switching transistor electrically coupled between the drain select line of the selected memory block and a ground terminal, a source switching transistor electrically coupled between the source select line and the ground terminal, and a pipe switching transistor electrically coupled between the pipe line and the ground terminal.

13. The method of claim 10, further comprising:

floating word lines electrically coupled to the memory cells of the unselected memory blocks.

14. The method of claim 10, comprising:

turning off drain switching transistors electrically coupled between the drain select lines of the unselected memory blocks and a ground terminal and source switching transistors electrically coupled between the source select lines and the ground terminal; and turning on pipe switching transistors electrically coupled between the pipe lines of the unselected memory blocks and the ground terminal.

15. The method of claim 10, further comprising:

maintaining at least one of the drain select lines and the source select lines electrically coupled to the unselected memory blocks in a floating state.

16. The method of claim 15, further comprising:
outputting drain switching signals, source switching signals, and pipe switching signals.

17. The method of claim 10, further comprising:
applying a lower voltage level to pipe lines electrically coupled to the unselected memory blocks.

18. The method of claim 17, further comprising:
applying the lower voltage level to the pipe lines to block a current that flows to a common source line.

* * * * *